United States Patent [19]

Kawase et al.

[11] Patent Number: 5,830,269
[45] Date of Patent: Nov. 3, 1998

[54] METHOD OF PREPARING GROUP II-VI OR III-V COMPOUND SINGLE CRYSTAL

[75] Inventors: Tomohiro Kawase; Masami Tatsumi, both of Hyogo; Yoshihiro Wakayama, Osaka, all of Japan

[73] Assignee: Sumitomo Electric Industries, Ltd., Osaka, Japan

[21] Appl. No.: 653,466

[22] Filed: May 24, 1996

[30] Foreign Application Priority Data

| May 26, 1995 | [JP] | Japan | 7-128156 |
| May 26, 1995 | [JP] | Japan | 7-128163 |
| Sep. 11, 1995 | [JP] | Japan | 7-233045 |
| Sep. 11, 1995 | [JP] | Japan | 7-233047 |

[51] Int. Cl.$^6$ .................................................. C30B 13/18
[52] U.S. Cl. ............................... 117/83; 117/81; 427/226
[58] Field of Search ........................ 117/81, 82, 83; 427/226

[56] References Cited

U.S. PATENT DOCUMENTS

| 3,734,817 | 5/1973 | Bienert et al. |
| 3,928,096 | 12/1975 | Vergano et al. ................... 438/567 |
| 4,923,561 | 5/1990 | Chemans et al. .................. 117/83 |
| 4,999,082 | 3/1991 | Kremer et al. .................... 252/62.36 A |
| 5,131,975 | 7/1992 | Bourret-Courchesne ........... 117/82 |
| 5,584,929 | 12/1996 | Kawase ............................ 117/11 |
| 5,648,442 | 7/1997 | Bowers et al. .................... 526/277 |
| 5,656,077 | 8/1997 | Kawase ............................ 117/200 |

FOREIGN PATENT DOCUMENTS

| 0104741 | 4/1984 | European Pat. Off. |
| 0222404A1 | 5/1987 | European Pat. Off. |
| 0104471B1 | 7/1990 | European Pat. Off. |
| 010474B1 | 7/1990 | European Pat. Off. |
| 0417843 | 3/1991 | European Pat. Off. |
| 0671490 | 9/1995 | European Pat. Off. |
| 60-191094 | 9/1985 | Japan . |
| 62-176998 | 8/1987 | Japan . |
| 49-42419 | 11/1987 | Japan . |
| 1290589 | 11/1989 | Japan . |
| 2-44798 | 10/1990 | Japan . |
| 3-122097 | 5/1991 | Japan . |
| 4-63234 | 2/1992 | Japan . |
| 06-239686 | 8/1994 | Japan . |
| 6-239686 | 8/1994 | Japan . |

OTHER PUBLICATIONS

G. Ajithkumar et al., "A Crystal Growth System with modified pulling arrangement and temperature controller", 8056 Measurement Sci. & Tech. 5 (1994) Aug., No. 8, pp. 1018–1020.

Japanese Industrial Standard, Surface roughness–13 Definitions and designation; JIS B 0601–1994; Translated and Published by Japanese Standards Association, cover sheet and pp. 1–25.

"Surface Texture Parameters Reference Book", Manual No. 4373, Series No. 178, Surf Test 201, 301, published by Mitutoyo; (see sections 3.5 and 3.7).

Primary Examiner—Felisa Garrett
Attorney, Agent, or Firm—W. G. Fasse; W. F. Fasse

[57] ABSTRACT

A method is provided for industrially preparing a group II–VI or III–V compound single crystal from a polycrystalline group II–VI or III–V starting compound, such that the resultant single crystal has a small number of crystal defects by effectively preventing polycrystallization. The method includes steps of coating an inner surface of a crucible with a film consisting of powdered solids and a vitreous substance, placing the polycrystalline compound in the coated crucible, placing the crucible in a furnace, heating the crucible with furnace for melting the polycrystalline compound in the crucible, and cooling the crucible and the melted compound for growing a single-crystalline compound. Additionally, the surface of a seed crystal and a gap between the seed crystal and a wall of the crucible may also be coated with a film of powdered solids and a vitreous substance.

48 Claims, 9 Drawing Sheets

SUCTION

METHOD OF PREPARING GROUP II-VI OR III-V COMPOUND SINGLE CRYSTAL

CROSS-REFERENCE TO RELATED APPLICATIONS

This application is related to copending and commonly assigned U.S. patent application Ser. No. 08/400,925, filed Mar. 9, 1995, now U.S. Pat. No. 5,584,929, which issued on Dec. 17, 1996; and to copending and commonly assigned U.S. patent application Ser. No. 08/503,702, filed on Jul. 18, 1995, now U.S. Pat. No. 5,656,077, which issued on Aug. 12, 1997.

BACKGROUND OF THE INVENTION

1. Field of the Invention

The present invention relates to a method of preparing a group II–VI or III–V compound single crystal, and more particularly, it relates to a method of preparing a group II–VI or III–V compound single crystal which may be employed for optoelectronic devices, such as light emitting diodes (LED), laser diodes and the like, and for microwave devices.

2. Description of the Background Art

Group III–V and II–VI compound semiconductor single crystals include those of gallium arsenide (GaAs), gallium phosphide (GaP), indium phosphide (InP) and cadmium telluride (CdTe), for example.

It is known that such compound semiconductor single crystals are generally prepared by various industrial methods such as horizontal Bridgeman method (HB method), liquid encapsulated Czochralski method (LEC method), vertical Bridgeman method (VB), and vertical gradient freeze method (VGF method).

Among these methods, the VB method, for example, is adapted to prepare a compound semiconductor single crystal in the following manner:

In general, a vertical furnace having at least one high temperature zone and at least one low temperature zone is employed in the VB method. These zones are designed to provide a temperature profile consisting of high and low temperature zones having relatively homogeneous temperatures, which are divided or separated from each other by a critical zone having a temperature gradient of about 5° to 20° C./cm.

First, a vertically arranged crucible (made of pBN in general) which is suitable for containing a group II–VI or III–V compound is arranged in a sealed ampoule. Growth of a single crystal is initiated and caused to progress by slowly moving up the furnace while immovably holding the crucible-ampoule assembly.

The VB method of preparing a compound semiconductor comprises the steps of placing a seed single crystal on a bottom portion of the crucible, introducing a polycrystalline substance into the crucible, placing the crucible in the ampoule and thereafter sealing the ampoule, placing this crucible-ampoule assembly on a crucible support which is provided inside the aforementioned vertically arranged furnace, heating the polycrystalline substance and the upper portion of the seed single crystal to a temperature exceeding the melting point thereof, and upwardly moving the furnace by the length of the melt obtained by melting of the polycrystalline substance, thereby forming a solid single-crystalline substance.

The ingot of the group II–VI or III–V compound single crystal prepared in the aforementioned manner is then taken out of the crucible, and sliced into wafers for various optoelectronic and microwave devices.

The above described VB method is expected to be a promising method which can prepare a high-quality crystal, having a lower defect density at a lower cost as compared with the other known methods. However, in practice it has been found that a problem of occurrence of crystal defects still cannot be completely solved by this VB method.

Namely, thermal stress is caused in a contact area due to a difference between the thermal expansion coefficients of a container such as a crucible and the crystal, which results in generation of dislocations, and resulting polycrystallization.

In order to prevent such polycrystallization, it is effective to reduce the coefficient of friction at the contact surface between the container and the crystal. In more concrete terms, it may be effective to make the container and the raw material melt hardly wettable with respect to each other, or to employ a lubricant.

In order to improve the wettability characteristics of the container and the raw material melt, it has generally been considered to employ quartz as the material for the container, for example. According to this method, no contamination is caused in relation to boron. However, this method is unsuitable for industrial preparation since it is difficult to increase the dimensions of the container consisting of quartz.

On the other hand, a method employing liquified boron oxide ($B_2O_3$) has been studied as the method of employing a lubricant, for example. Such employment of $B_2O_3$ is also adapted to prevent a melted or crystallized compound such as GaAs from decomposition and volatilization of a volatile component such as arsenic (As). At room temperature, however, $B_2O_3$ is solidified and hence the crystal and the crucible become fixed to each other. In the case of using a crucible of pyrolytic boron nitride (pBN), therefore, the pBN is disadvantageously delaminated to reduce the life of the crucible.

In growth of a silicon (Si) doped GaAs single crystal, for example, a replacement reaction takes place between the dopant of Si and boron (B) contained in $B_2O_3$ at the interface between the GaAs melt and $B_2O_3$. Thus, a decrease of the Si concentration and an increase of the boron concentration are disadvantageously caused.

U.S. Pat. No. 4,999,082 (1991: hereinafter referred to as "prior art") discloses a method of improving such a conventional method to prevent polycrystallization.

The method disclosed in this prior art is characterized in that an inner surface of a crucible is coated with powdered solids in place of $B_2O_3$. In more concrete terms, solid boron nitride (BN) powder is employed.

According to this prior art, the crystal does not become stuck in or to the crucible dissimilarly to the case of employing liquefied $B_2O_3$, whereby the life of the crucible can be effectively increased.

However, adhesion of the BN powder to the crucible is insufficient under conditions disclosed in the prior art. Thus, the BN powder cannot homogeneously adhere to the inner surface of the crucible.

According to this prior art, the BN powder is applied by a method of sprinkling the powder on the inner surface of the crucible in a dry state, or a method of applying a slurry of the solid powder and a carrier liquid consisting of a mixture of water and alcohol or the like, for example, to the inner surface of the crucible and thereafter evaporating the carrier liquid. Thus, the adhesion of the BN powder to the crucible is so small that the applied BN powder disadvantageously falls from the inner surface of the crucible.

FIG. 14 typically illustrates the state of an interface between a crucible and a GaAs melt in preparation of a GaAs single crystal by the prior art.

Referring to FIG. 14, BN particles 3 are applied to a surface of a pBN crucible 1 according to the prior art, while the BN particles 3 have partially fallen off at a part A. In such a part A, the crucible 1 and the GaAs melt 2 are in contact and wetted, which causes frictional force, resulting in the occurrence of polycrystallization.

Also when the BN particles 3 have large particle sizes, the GaAs melt 2 and the BN particles 3 are wetted to cause crystal defects.

On the other hand, the VB method of preparing a single crystal also has the following problem: When the seed crystal is arranged on the bottom portion of the crucible, a gap is disadvantageously formed between the crucible and the seed crystal. When a raw material melt such as a GaAs melt infiltrates into this gap, solidification of the melt is started not from the seed crystal side but from the crucible wall surface side, to disadvantageously cause polycrystallization.

SUMMARY OF THE INVENTION

An object of the present invention is to provide a method which can industrially prepare a group II–VI or III–V compound single crystal having a low defect density by solving the aforementioned problems and effectively preventing polycrystallization.

According to an aspect of the present invention, a method of preparing a group II–VI or III–V compound single crystal is provided. This method is adapted to prepare a single-crystalline group II–VI or III–V compound from a polycrystalline group II–VI or III–V compound, and comprises the steps of coating an inner surface of a crucible with a film consisting of powdered solids having a melting point which is higher than that of the polycrystalline compound and a vitreous substance, placing the polycrystalline compound in the coated crucible, placing the coated crucible having the polycrystalline compound therein into heating means such as a furnace, heating the crucible in and with the heating means for melting the polycrystalline compound in the crucible, and cooling the crucible and the melted compound for growing a single-crystalline compound.

According to another aspect of the present invention, a method of preparing a group II–VI or III–V compound single crystal is provided. This method is adapted to prepare a single-crystalline group II–VI or III–V compound from a polycrystalline group II–VI or III–V compound in a vertically arranged crucible, and comprises the steps of coating an inner surface of the crucible with a film consisting of powdered solids having a melting point which is higher than that of the polycrystalline compound and a vitreous substance, placing a seed crystal consisting of a single-crystalline compound on a bottom portion of the crucible, placing the polycrystalline compound in the remaining portion of the crucible, placing the crucible which has the seed crystal and the polycrystalline compound therein into a vertically arranged furnace which is capable of forming an upper high temperature zone and a lower low temperature zone, adjusting the position of the furnace and the temperature of the upper high temperature zone thereby melting the polycrystalline compound while maintaining a part of the seed crystal in a solid state in the crucible, setting the lower low temperature zone at a temperature which is lower than the melting point of the single-crystalline compound while setting the upper high temperature zone at a temperature which is higher than the melting point thereby forming a solid-liquid interface, and upwardly vertically moving the furnace and the solid-liquid interface while substantially retaining the temperature setting in the lower low temperature zone and the upper high temperature zone thereby growing a single-crystalline compound.

In the present invention, the step of coating the inner surface of the crucible with the film consisting of the powdered solids and the vitreous substance preferably includes the steps of applying a mixed solution containing the powdered solids and a silanol compound to the inner surface of the crucible, and vacuum-heating the crucible which has the mixed solution applied thereto, thereby forming the film containing the powdered solids and the vitreous substance consisting of silicon oxide on the inner surface of the crucible.

The mixed solution containing the powdered solids and the silanol compound may be applied to the inner surface of the crucible in a liquid state, or the former may be sprayed onto the latter.

The mixed solution is preferably applied to the inner surface of the crucible by recoating at least twice. When a thick film is formed by a single coating, the film may be cracked or readily separated from the crucible. In such recoating, the first layer must be temporarily baked before forming a next layer.

The vacuum heat treatment following the application of the mixed solution to the crucible is preferably performed at a temperature of at least 500° C. for at least 1 hour, more preferably at a temperature of about 1000° C. for 2 or 3 hours.

Due to the vacuum heat treatment, silanol contained in the applied mixed solution is converted to silicon oxide ($SiO_2$) through a heating/polymerization reaction.

According to the present invention, the vitreous substance preferably has a softening temperature which is lower than the melting point of the polycrystalline compound.

The vitreous substance is prepared from diboron trioxide ($B_2O_3$) or a mixture of diboron trioxide ($B_2O_3$) and silicon dioxide ($SiO_2$), for example.

According to the present invention, the powdered solids are prepared from boron nitride, for example.

According to the present invention, further, the powdered solids can be prepared from a substance having lubricity such as graphite, in place of boron nitride.

When boron nitride is employed in the present invention, its mean particle size is preferably at least 0.05 $\mu$m and not more than 10 $\mu$m. The powdered solids are easy to wet, which would thus cause crystal defects, if the mean particle size of the boron nitride is in excess of 10 $\mu$m.

Throughout the specification, the particle sizes of boron nitride are defined as those of primary particles 10 also when the primary particles 10 of boron nitride (BN) aggregate to form a secondary particle 20 as shown in FIG. 16, for example.

In the present invention, the inner surface of the crucible preferably has a prescribed surface roughness in an uncoated state.

As to the prescribed surface roughness of the inner surface of the crucible, the maximum roughness $R_{max}$ thereof (also known as "maximum height $R_y$" according to JIS B 0601-1994) is preferably 10 to 150 $\mu$m, and the arithmetical mean roughness $R_a$ is preferably 3 to 15 $\mu$m.

The term "maximum roughness $R_{max}$" or "maximum height $R_y$" indicates a value obtained by measuring a space between two straight lines, which are parallel to an average line, and which enclose therebetween a profile line of a portion of an evaluation length Lm extracted from the profile line in the direction of its average line along a direction of an axial magnification.

The term "profile line" indicates a contour appearing on a section when a measured surface is cut along a plane which is perpendicular to a mean surface of the measured surface. The term "average line" indicates a straight line having the averaged geometry of the measured surface in the extracted portion of the profile line, which is set to minimize the sum of squares of the deviations from the line to the profile line.

The term "arithmetical mean roughness $R_a$" indicates a value obtained by the following equation when a portion of the evaluation length Lm is extracted from a roughness curve in the direction of its center line, the center line of the extracted portion and the direction of axial magnification are set on X- and Y-axes respectively, and the roughness curve is expressed as Y(x):

$$Ra = \frac{1}{Lm} \int_0^{Lm} |Y(x)| dx$$

The term "roughness curve" indicates a curve obtained by a measuring method having a characteristic of removing a low frequency component from the profile line. The term "center line" indicates a straight line, which is parallel to the average line of the roughness curve, and which makes areas enclosed between the straight line and the roughness curve equal on both sides of the straight line.

All of the above indices of the surface roughness are in accordance with JIS B0601-1994.

Adhesion of the film to the crucible is improved due to such in-crucible surface roughness.

According to still another aspect of the present invention, a method of preparing a group II–VI or III–V compound single crystal is provided. This method is adapted to prepare a single-crystalline group II–VI or III–V compound from a polycrystalline group II–VI or III–V compound in a vertically arranged crucible, and comprises the steps of coating an outer surface of a seed crystal consisting of a single-crystalline compound with a film consisting of powdered solids having a melting point which is higher than that of the polycrystalline compound and a vitreous substance, placing the coated seed crystal on a bottom portion of the crucible, placing the polycrystalline compound in the remaining portion of the crucible, placing the crucible which has the seed crystal and the polycrystalline compound therein into a vertically arranged furnace which is capable of forming an upper high temperature zone and a lower low temperature zone, adjusting the position of the furnace and the temperature of the upper high temperature zone thereby melting the polycrystalline compound while maintaining a part of the seed crystal in a solid state in the crucible, setting the lower low temperature zone at a temperature which is lower than the melting point of the single-crystalline compound while setting the upper high temperature zone at a temperature which is higher than the melting point thereby forming a solid-liquid interface, and upwardly vertically moving the furnace and the solid-liquid interface while substantially retaining the temperature setting in the lower low respective temperature zone and the upper high temperature zone thereby growing a single-crystalline compound.

In the present invention, the step of coating the outer surface of the seed crystal with the film consisting of the powdered solids and the vitreous substance preferably includes the steps of applying a mixed solution containing the powdered solids and a silanol compound to the outer surface of the seed crystal, and vacuum-heating the seed crystal which has the mixed solution applied thereto, thereby forming the film containing the powdered solids and the vitreous substance consisting of silicon oxide on the outer surface of the seed crystal.

After the application of the mixed solution to the seed crystal, the vacuum heat treatment is preferably performed at a temperature of about 500° to 600° C. for at least 30 minutes, more preferably at a temperature of 500° to 600° C. for 2 to 3 hours, in order to prevent the seed crystal from undergoing decomposition or deterioration. Due to the vacuum heat treatment, silanol contained in the applied mixed solution is converted to silicon oxide ($SiO_2$) through heating and polymerization reaction.

In the present invention, the step of applying the mixed solution to the outer surface of the seed crystal is carried out by dipping the seed crystal in the mixed solution, or by spraying the mixed solution onto the outer surface of the seed crystal.

When the mixed solution is sprayed, acetone is preferably mixed into the mixed solution. Spray applicability is improved and internal strain of the film is reduced due to such mixing of acetone.

According to the present invention, the vitreous substance for coating the outer surface of the seed crystal preferably has a softening temperature which is lower than the melting point of the polycrystalline compound, similarly to the case of coating the inner surface of the crucible.

The vitreous substance is prepared from diboron trioxide ($B_2O_3$) or a mixture of diboron trioxide ($B_2O_3$) and silicon dioxide ($SiO_2$), for example.

According to the present invention, the powdered solids are prepared from boron nitride, for example. When boron nitride is employed, its mean particle size is preferably at least 0.05 $\mu$m and not more than 10 $\mu$m. The powdered solids are easy to wet which would thus cause crystal defects, if the mean particle size of the boron nitride is in excess of 10 $\mu$m.

According to a further aspect of the present invention, a method of preparing a group II–VI or III–V compound single crystal is provided. This method is adapted to prepare a single-crystalline group II–VI or III–V compound from a polycrystalline group II–VI or III–V compound in a vertically arranged crucible, and comprises the steps of coating an inner surface of the crucible with a film consisting of powdered solids having a melting point which is higher than that of the polycrystalline compound and a vitreous substance, coating an outer surface of a seed crystal consisting of a single-crystalline compound with a film consisting of powdered solids having a melting point which is higher than that of the polycrystalline compound and a vitreous substance, placing the coated seed crystal on a bottom portion of the crucible, placing the polycrystalline compound in the remaining portion of the crucible, placing the crucible which has the seed crystal and the polycrystalline compound therein into a vertically arranged furnace which is capable of forming an upper high temperature zone and a lower low temperature zone, adjusting the position of the furnace and the temperature of the upper high temperature zone thereby melting the polycrystalline compound while maintaining a part of the seed crystal in a solid state in the crucible, setting the lower low temperature zone at a temperature which is lower than the melting point of the single-crystalline compound while setting the upper high temperature zone at a temperature which is higher than the melting point thereby forming a solid-liquid interface, and upwardly vertically moving the furnace and the solid-liquid interface while substantially retaining the respective temperature setting in the lower low temperature zone and the upper high temperature zone thereby growing a single-crystalline compound.

This method preferably further comprises a step of coating a gap between the crucible and the seed crystal with a film consisting of powdered solids and a vitreous substance after placing the seed crystal on the bottom portion of the crucible.

In this case, a mixed solution containing the powdered solids and a silanol compound is preferably applied to the gap between the crucible and the seed crystal and is thereafter vacuum-heated, similarly to the case of forming the film on the inner surface of the crucible or the outer surface of the seed crystal. The vacuum heating is preferably performed at a temperature of about 500° to 600° C., in order to prevent the seed crystal from undergoing decomposition or deterioration. When the seed crystal is arranged on the bottom portion of the crucible, the gap between the crucible and the seed crystal is completely filled by such formation of the film, thereby preventing solidification and resulting polycrystallization of a raw material melt infiltrating into the gap.

In the method of preparing a group II–VI or III–V compound single crystal according to the present invention, the group II–VI or III–V compound is prepared from gallium arsenide, for example. Furthermore, the compound employed in the present invention may be prepared from a group III–V compound such as InP or GaP, or a group II–VI compound such as ZeSe or CdTe, for example.

According to a further aspect of the present invention, a method of preparing a group II–VI or III–V compound single crystal is provided. This method is adapted to prepare a single-crystalline group II–VI or III–V compound from a polycrystalline group II–VI or III–V compound, and comprises the steps of coating an inner surface of a crucible with powdered solids having a melting point which is higher than that of the polycrystalline compound mixed in a binder consisting of a vitreous substance, placing the polycrystalline compound in the coated crucible, placing the crucible which has the polycrystalline compound therein into heating means, heating the crucible in and with the heating means thereby melting the polycrystalline compound in the crucible, and cooling the crucible and the melted compound thereby growing a single-crystalline compound.

According to the present invention, the inner surface of the crucible is coated with a film consisting of the powdered solids and the vitreous substance.

FIG. 13 typically illustrates the state of an interface between a crucible 1, having an inner surface which is coated with a film consisting of powdered solids 3 and a vitreous substance 13, and a raw material melt 2.

Referring to FIG. 13, vitreous substance parts 13a which are positioned between the respective powdered solids 3 and vitreous substance parts 13b which are positioned between the powdered solids 3 and the crucible 1 act as a binder, whereby high adhesion of the film to the crucible 1 is attained. Thus, the film will not be separated from the crucible 1, dissimilarly to the prior art. Consequently, the powdered solids 3 can sufficiently provoke an effect for serving as a lubricant.

According to the present invention, the surfaces of the powdered solids 3 are coated with vitreous substance parts 13c. The vitreous substance 13 such as $SiO_2$ is hardly wetted with the raw material melt 2 such as a GaAs melt, as compared with substances of BN or the like. Thus, it is possible to effectively prevent occurrence of crystal defects caused by wetting.

According to a further aspect of the present invention, a method of preparing a group II–VI or III–V compound single crystal is provided. This method is adapted to prepare a single-crystalline group II–VI or III–V compound from a polycrystalline group II–VI or III–V compound in a vertically arranged crucible, and comprises the steps of coating an inner surface of the crucible with powdered solids having a melting point which is higher than that of the polycrystalline compound mixed in a binder consisting of a vitreous substance, placing a seed crystal consisting of a single-crystalline compound on a bottom portion of the crucible, placing the polycrystalline compound in the remaining portion of the coated crucible, placing the crucible which has the seed crystal and the polycrystalline compound therein into a vertically arranged furnace which is capable of forming an upper high temperature zone and a lower low temperature zone, adjusting the position of the furnace and the temperature of the upper high temperature zone thereby melting the polycrystalline compound while maintaining a part of the seed crystal in a solid state in the crucible, setting the lower low temperature zone at a temperature which is lower than the melting point of the single-crystalline compound while setting the upper high temperature zone at a temperature which is higher than the melting point thereby forming a solid-liquid interface, and upwardly vertically moving the furnace and the solid-liquid interface while substantially retaining the respective temperature setting in the lower low temperature zone and the upper high temperature zone thereby growing a single-crystalline compound.

According to a further aspect of the present invention, a method of preparing a group II–VI or III–V compound single crystal is provided. This method is adapted to prepare a single-crystalline group II–VI or III–V compound from a polycrystalline group II–VI or III–V compound, and comprises the steps of coating an outer surface of a seed crystal consisting of a single-crystalline compound with powdered solids having a melting point which is higher than that of the polycrystalline compound mixed in a binder consisting of a vitreous substance, placing the coated seed crystal on a bottom portion of a crucible, placing the polycrystalline compound in the remaining portion of the coated crucible, placing the crucible which has the seed crystal and the polycrystalline compound therein into a vertically arranged furnace which is capable of forming an upper high temperature zone and a lower low temperature zone, adjusting the position of the furnace and the temperature of the upper high temperature zone thereby melting the polycrystalline compound while maintaining a part of the seed crystal in a solid state in the crucible, setting the lower low temperature zone at a temperature which is lower than the melting point of the single-crystalline compound while setting the upper high temperature zone at a temperature which is higher than the melting point thereby forming a solid-liquid interface, and upwardly vertically moving the furnace and the solid-liquid interface while substantially retaining the respective temperature setting in the lower low temperature zone and the upper high temperature zone thereby growing a single-crystalline compound.

According to the present invention, the outer surface of the seed crystal is coated with a film consisting of the powdered solids and the vitreous substance. Therefore, no gap is formed between the crucible and the seed crystal when the seed crystal is arranged on the bottom portion of the crucible, whereby solidification of a raw material melt from a wall surface of the crucible and resulting polycrystallization are prevented. According to the present invention, further, the film consists of the powdered solids and the vitreous substance. Thus, it is possible to form a homogeneous film having high adhesion to the seed crystal.

FIG. 17 typically illustrates the state of an outer surface of a seed crystal 7 which is coated with a film consisting of powdered solids 3 and a vitreous substance 13 according to the present invention.

Referring to FIG. 17, vitreous substance parts 13a which are positioned between the respective powdered solids 3 serving as a lubricant, and vitreous substance parts 13b which are positioned between the powdered solids 3 serving as a lubricant and the seed crystal 7, act as a binder, whereby a homogeneous film having strong adhesion to the seed crystal 7 is formed as described above.

According to a further aspect of the present invention, a method of preparing a group II–VI or III–V compound single crystal is provided. This method is adapted to prepare a single-crystalline group II–VI or III–V compound from a polycrystalline group II–VI or III–V compound in a vertically arranged crucible, and comprises the steps of coating an inner surface of the crucible with powdered solids having a melting point which is higher than that of the polycrystalline compound mixed in a binder consisting of a vitreous substance, coating an outer surface of a seed crystal consisting of a single-crystalline compound with powdered solids having a melting point which is higher than that of the polycrystalline compound mixed in a binder consisting of a vitreous substance, placing the coated seed crystal on a bottom portion of the crucible, placing the polycrystalline compound in the remaining portion of the coated crucible, placing the crucible which has the seed crystal and the polycrystalline compound therein into a vertically arranged furnace which is capable of forming an upper high temperature zone and a lower low temperature zone, adjusting the position of the furnace and the temperature of the upper high temperature zone thereby melting the polycrystalline compound while maintaining a part of the seed crystal in a solid state in the crucible, setting the lower low temperature zone at a temperature which is lower than the melting point of the single-crystalline compound while setting the upper high temperature zone at a temperature which is higher than the melting point thereby forming a solid-liquid interface, and upwardly vertically moving the furnace and the solid-liquid interface while substantially retaining the respective temperature setting in the lower low temperature zone and the upper high temperature zone thereby growing a single-crystalline compound.

According to the present invention, as hereinabove described, polycrystallization is effectively prevented due to improvement of the adhesion and wettability of the film, whereby a group II–VI or III–V compound single crystal having a small number of crystal defects can be prepared.

Also in growth of an Si-doped GaAs single crystal, a replacement reaction hardly takes place between the dopant of Si and BN or $B_2O_3$ contained in BN, whereby decrease of the Si concentration is suppressed while the contamination by B is reduced.

According to the present invention, further, the film which is formed on the inner surface of the crucible contains the vitreous substance so that the film is not separated from the crucible, whereby a homogeneous film can be formed. Thus, it is possible to cope with a size increase of the crystal, whereby the present invention is particularly effective for preparation of single crystals in an industrial scale.

According to the present invention, in addition, the inner surface of the crucible is not damaged by formation of the film, whereby the life of the crucible is not reduced. Consequently, it is possible to prepare the single crystal at a low cost.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
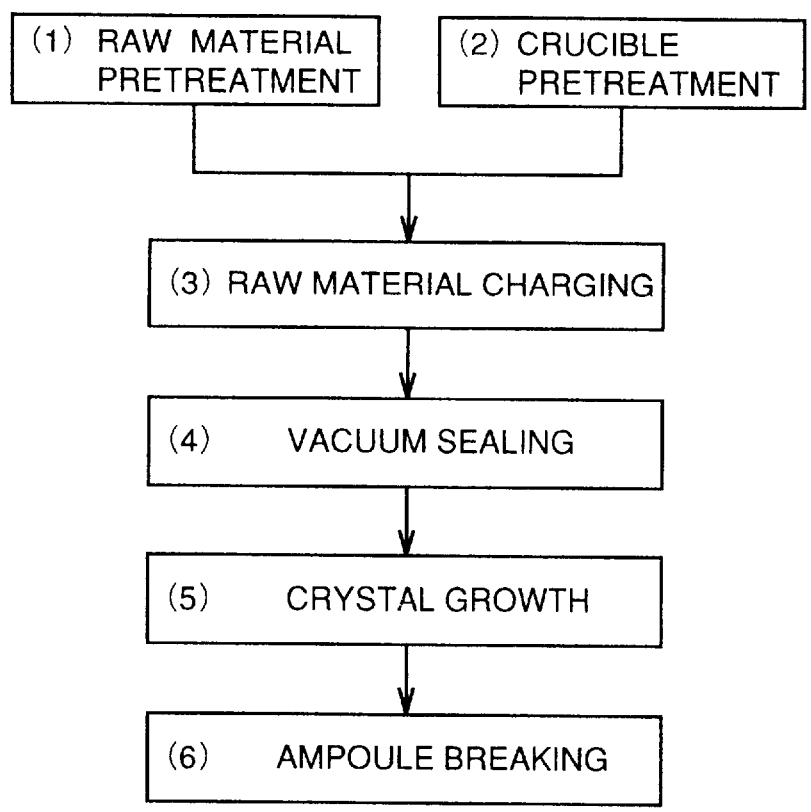
FIG. 1 illustrates exemplary steps of preparing a group II–VI or III–V compound single crystal.

FIG. 1 illustrates exemplary steps of preparing a group II–VI or III–V compound single crystal.

The respective steps shown in FIG. 1 are now described.

(1) Raw Material Pretreatment Step

First, a raw material consisting of a GaAs polycrystal which was synthesized by a boat method was chamfered, in order to prevent a film formed on an inner surface of a crucible from being separated by an edge of the raw material.

On the other hand, a seed crystal (hereinafter referred to as a seed) consisting of a GaAs single crystal was also chamfered, similarly to the polycrystalline raw material, in order to prevent the film formed on the inner surface of the crucible from being separated upon insertion of the seed in a bottom portion of the crucible.

Then, etching was performed on the polycrystalline raw material and the seed treated in the aforementioned manner, for removing impurities from surfaces thereof. The etching was performed under the following ordinary etching conditions:

1) Exemplary Etching Conditions 1 (in case of employing sulfuric acid etching solution)

etching solution composition: sulfuric acid:hydrogen peroxide:water=3:1:1 temperature of etching solution: 60° C.

etching time: about 20 minutes for the polycrystalline raw material and 1 to 2 minutes for the seed 2) Exemplary Etching Conditions 2 (in case of employing aqua regia)

etching solution composition: nitric acid:hydrochloric acid=1:3 temperature of etching solution: room temperature etching time: about 20 minutes for the polycrystalline material and about 8 minutes for the seed (2) Crucible Pretreatment Step (EXAMPLE 1)

Figure 2:
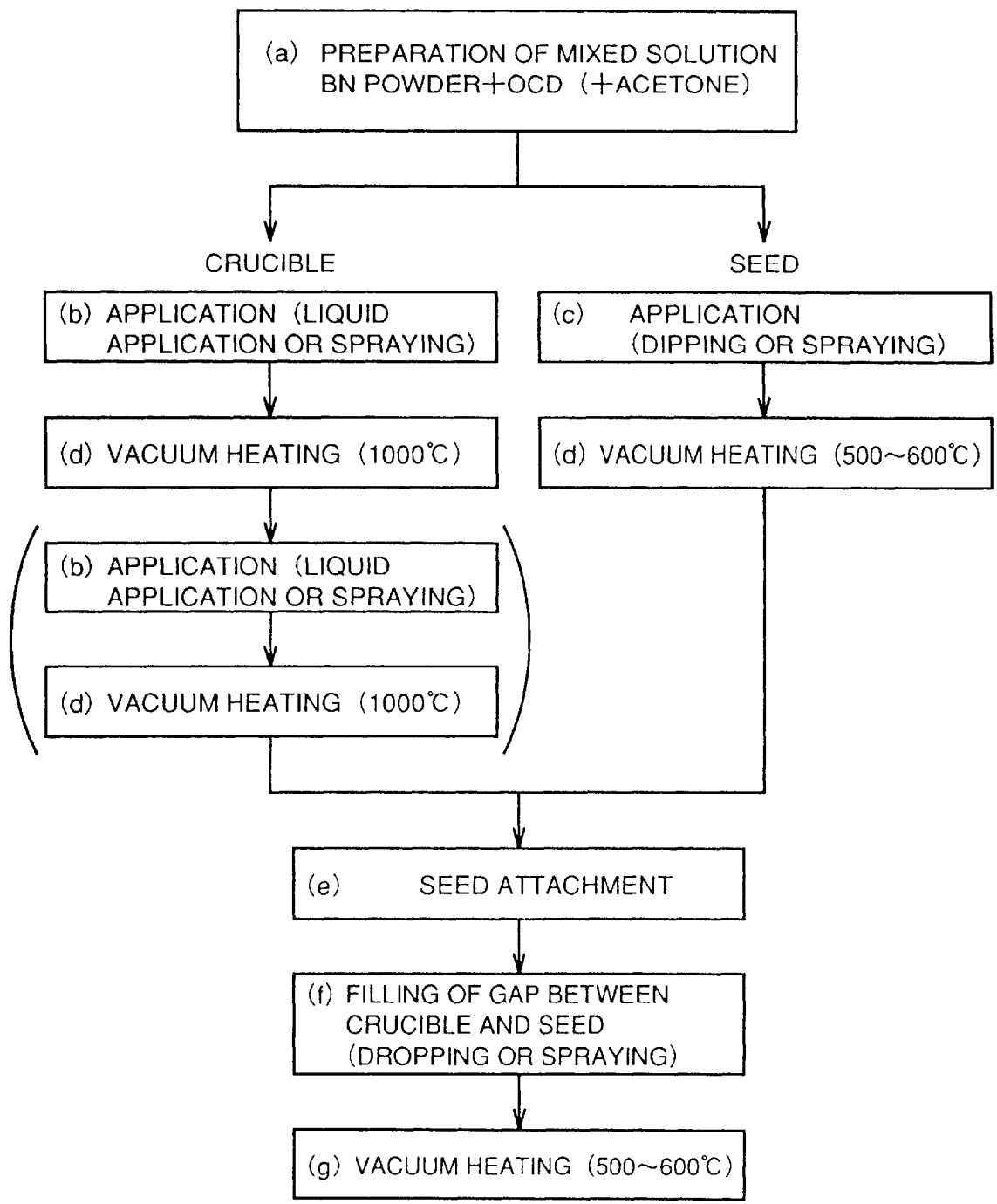
FIG. 2 illustrates an exemplary crucible pretreatment step according to the present invention.

FIG. 2 illustrates an exemplary crucible pretreatment step.

The crucible pretreatment step is now described with reference to FIG. 2.

(a) Preparation of Mixed Solution

BN powder having a mean particle size of not more than 10 μm was employed. This powder had an oxygen concentration of not more than 3 wt %. The oxygen concentration of the powder is preferably reduced to hardly react with a dopant.

Silanol compounds were prepared from OCD by Tokyo Ohka Kogyo Co., Ltd., which is a liquid consisting of a silanol compound and a solvent.

In this experiment, two types of compounds were used, including an inorganic system Type 2 (containing 5.9 wt. % of $Si(OH)_4$ with a solvent of ethyl acetate) and an organic system Type 7 (containing 12 wt. % of $RnSi(OH)_{4-n}$, where R represents an alkyl group, with a solvent of methanol). Both of the Types 2 and 7 were employable up to concentrations of 20 wt. %.

With such BN particles and silanol compounds, mixed solutions were prepared as follows:

1) In case of applying the mixed solution in a liquid state:

TABLE 1

|  | BN Powder | OCD | Acetone |
| --- | --- | --- | --- |
| Mixed Solution Mixing Example 1 | Crystal 10 μm 33 g | inorganic system 5.9 wt % 87–88 g | not used |

In Table 1, "Crystal" means the particle size of the BN powder.

2) In case of spraying the mixed solution:

TABLE 2

|  | BN Powder | OCD | Acetone |
| --- | --- | --- | --- |
| Mixed Solution Mixing Example 2 | Crystal 0.5 μm 16–24 g | inorganic 5.9 wt % 87–88 g | 87–88 g |
| Mixed Solution Mixing Example 3 | Crystal 0.5 μm 16–24 g | inorganic 5.9 wt % 174–176 g | no used |
| Mixed Solution Mixing Example 4 | Crystal 10 μm 33 g | inorganic 5.9 wt % 87–88 g | 1 to 3 times of OCD |
| Mixed Solution Mixing Example 5 | Crystal 10 μm 33 g | inorganic 5.9 wt % 174–176 g | not used |

In Table 2, "Crystal" means the particle size of the BN powder.

As shown in Table 2, the mixed solution is preferably mixed with acetone, when the same is applied by spraying.

The first reason for mixing acetone into the solution resides in improvement of spray applicability.

Ethyl acetate or methanol forming the solvent of OCD is liquified upon continuous application due to its low volatility, and readily cracked or mottled after drying. Further, spray particles of OCD having high viscosity are so hardly atomized that it is difficult to form a homogeneous film. When such OCD is mixed with acetone, its volatility is so improved that the same is hardly liquified. Further, a homogeneous film is effectively obtained due to atomization.

The second reason for mixing acetone into the solution resides in a reduction of internal strain of the film.

When OCD is included in a high ratio, the film is so hardened that its internal strain is increased, although the same is hardly wetted with a GaAs melt. A film having high internal strain is readily separated due to cracking. When acetone is mixed into the solution, the OCD concentration is reduced, which reduces the internal strain of the film, thereby suppressing cracking or separation.

Tables 3 and 4 show results of a study which was carried out in relation to particle sizes of BN powder and acetone mixing ratios as to the mixed solutions. Referring to Tables 3 and 4, the term "defects" indicates generation of dislocations or polycrystals.

TABLE 3

| BN Particle Size | 0.5 μm (not more than 1 μm) | | 10 μm | |
| --- | --- | --- | --- | --- |
| Lubricity | excellent | few defects | inferior | many defects |
| Wetting | few | few twins | strong | many twins |
|  |  | few defects | (many) | many defects |
| Surface Smoothness | excellent | few twins | inferior | many twins |

TABLE 4

| Acetone Mixing Ratio | Low (High OCD Concentration) | | High (Low OCD Concentration) | |
| --- | --- | --- | --- | --- |
| Film Quality | hard | easy to crack | soft | hard to crack |
| Film Internal Stress | high | easy to separate | low | hard to separate |
| Wetting | hard to wet | hard to generate defect | easy to wet | easy to generate defect |

(b) Application of Mixed Solution to Crucible

The mixed solution can be applied to a crucible by applying the mixed solution to an inner surface of the crucible in a liquid state (liquid application), or by spraying the mixed solution.

Figure 3:
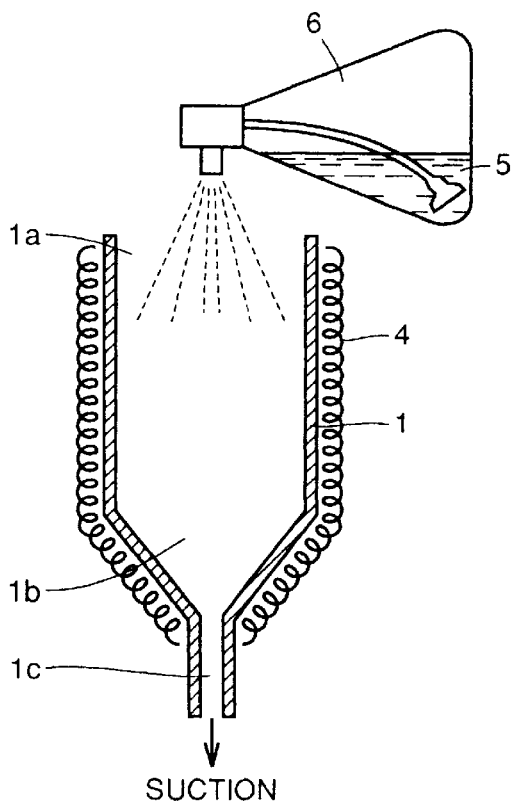
FIG. 3 illustrates a state of applying a mixed solution to a crucible by spraying according to the present invention.

FIG. 3 illustrates a state of applying a mixed solution to a crucible by spraying.

Referring to FIG. 3, a pBN crucible 1 is preferably heated by a band heater 4 between 50° and 150° C., and a mixed solution 5 is sprayed onto inner surfaces of the crucible by an atomizer 6. In this case, a solvent contained in the sprayed mixed solution 5 can be quickly dried for preventing the mixed solution 5 from dripping.

When the mixed solution 5 is sprayed through an opening 1a in an upper part of the crucible 1, the mixed solution 5 hardly adheres to a seed receiving portion 1c and a tapered portion 1b provided in a lower part of the crucible 1 since the same is deflected back by the wall of the crucible 1. Suction is applied to the lower open end of the seed receiving portion 1c. Therefore, the mixed solution 5 is sucked from the side of the seed receiving portion 1c, so that its adhesion to the tapered portion 1b and the seed receiving portion 1c is improved.

Figure 5:
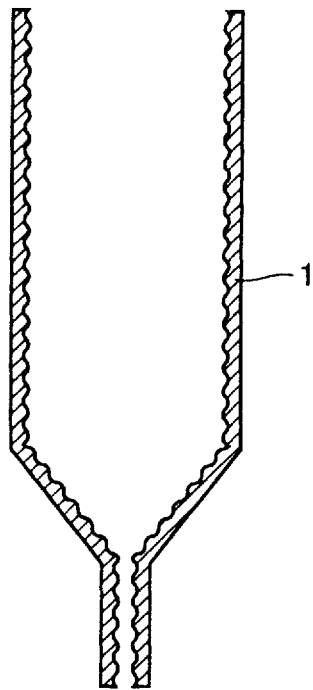
FIG. 5 is a sectional view showing an exemplary crucible employed in the present invention.

FIG. 5 is a sectional view showing an exemplary crucible 1 employed in the present invention.

Referring to FIG. 5, an inner surface of this crucible 1 is finely irregularized. When such a crucible 1 is employed, a film which is formed on its inner surface is hardly separated. As to the surface irregularity, the maximum height $R_y$ and the arithmetical mean roughness $R_a$ are preferably 10 to 150 $\mu$m and 3 to 15 $\mu$m respectively, for example.

When the mixed solution is thickly applied to the inner surface of the crucible at once, the film may be cracked or readily separated. Therefore, the mixed solution is preferably applied to the crucible at least twice.

A preferable thickness of a layer which is formed by single application is 50 to 500 $\mu$m in case of liquid application, and 50 to 1000 $\mu$m in case of spraying. When the mixed solution is applied twice, therefore, four types of application methods shown in Table 5 are conceivable, for example.

TABLE 5

| | First Layer | Second Layer |
| --- | --- | --- |
| Example 1 | liquid application | spraying |
| Example 2 | spraying | spraying |
| Example 3 | liquid application | liquid application |
| Example 4 | spraying | liquid application |

When the mixed solution is applied by recoating at least twice, a layer which is formed by the first application is preferably temporarily heat treated at about 1000° C. in advance of the second application. Due to this heat treatment, the strength of the layer formed by the first application is so improved that the film is not cracked upon recoating.

(c) Application of Mixed Solution to Seed

The mixed solution can be applied to a seed by dipping the seed in the mixed solution (submersion), or by spraying the mixed solution onto an outer surface of the seed.

The mixed solution mixing example 1 shown in Table 1 is preferable for the submersion application method, for example, while the mixed solution mixing example 2 shown in Table 2 is preferable for the spraying application method, for example.

A film is thus formed on the seed for the following reason. When a GaAs melt infiltrates into a gap between the seed and the crucible, without provision of a film, the melt may be solidified not from the seed side but from the crucible wall surface side, to be polycrystallized. When the film is formed on the seed, it is possible to prevent the seed and the crucible from making a gap therebetween, thereby preventing infiltration of the GaAs melt.

Figure 6:
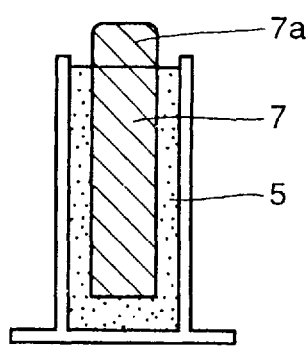
FIG. 6 illustrates a state of applying a mixed solution to a seed by dipping the seed in the solution according to the present invention.

FIG. 6 illustrates a state of applying a mixed solution 5 to a seed 7 by dipping the seed in the solution.

Referring to FIG. 6, a portion of the seed 7 excluding a forward end portion 7a is dipped in the mixed solution 5, and then the seed 7 is inserted in a crucible from the forward end portion 7a.

(d) Vacuum Heating of Crucible and Seed

Inorganic system OCD which is heated in a vacuum is converted to $SiO_2$ (quartz glass), due to removal of water from $Si(OH)_4$ by a heating and polymerization reaction.

When organic system OCD is heated in a vacuum, on the other hand, a small amount of graphite remains in addition to $SiO_2$. This graphite is so wettable with the GaAs melt that crystal defects (dislocations) may be caused by wetting.

Table 6 shows preferable vacuum heating conditions for the crucible and the seed.

TABLE 6

| | Degree of Vacuum | Temperature | Retention Time |
| --- | --- | --- | --- |
| Crucible | $10^{-2}$–$10^{-8}$ Torr (preferably $10^{-6}$–$10^{-8}$ Torr) | around 1000° C. | at least 1 h. (preferably 2 to 3 h.) |
| Seed | $10^{-2}$–$10^{-8}$ Torr (preferably $10^{-6}$–$10^{-8}$ Torr) | 500–600° C. | at least 30 min. (preferably 2 to 3 h.) |

When the heating temperature is in excess of 500° C., no problem arises in formation of $SiO_2$. However, it is conceivable that heating at 500° to 600° C. is suitable for a GaAs seed in order to prevent decomposition or deterioration of GaAs, although a pBN crucible can be heated at a high temperature of about 1500° C., for example.

The degree of vacuum does not exert a strong influence on formation of $SiO_2$ in particular. A gas flow of nitrogen ($N_2$) or argon (Ar) may be employed, for example, so far as water can be removed.

Figure 4:
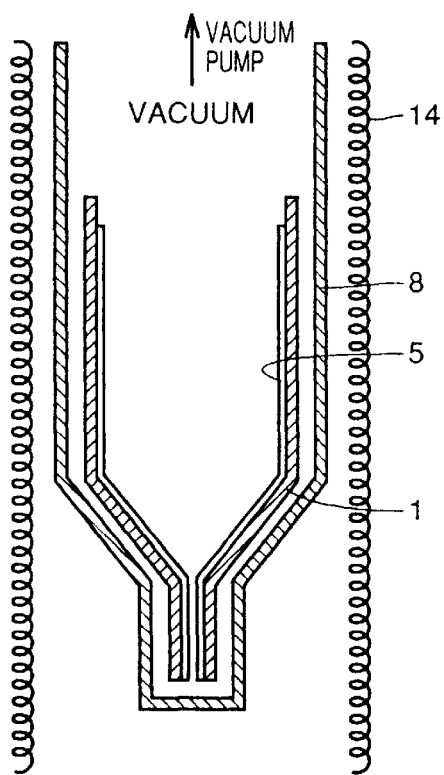
FIG. 4 illustrates a state of vacuum-heating the crucible having the mixed solution applied therein according to the present invention.

FIG. 4 illustrates a state of vacuum-heating the crucible 1 which has the mixed solution 5 applied to interior surfaces thereof.

Referring to FIG. 4, the crucible 1 having the mixed solution 5 thereon is arranged in a quartz vessel 8, which in turn is evacuated by a vacuum pump and heated by a heater 14 from the exterior.

Figure 7:
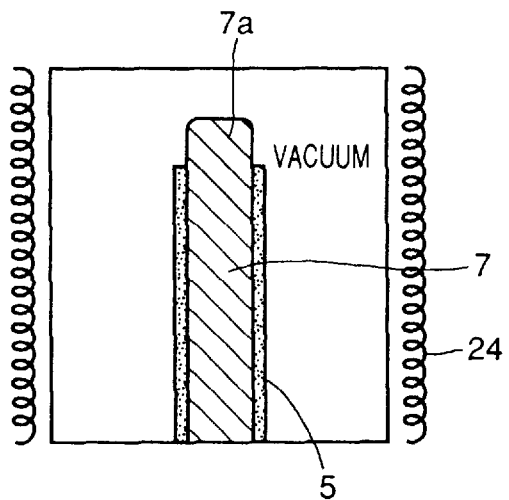
FIG. 7 illustrates a state of vacuum-heating the seed having the mixed solution applied thereto, according to the present invention.

On the other hand, FIG. 7 illustrates a state of vacuum-heating the seed 7 which is coated with the mixed solution 5. Referring to FIG. 7, the seed 7 coated with the mixed solution 5 is heat-treated in a vacuum by a heater 24. Due to such a vacuum heat treatment, films consisting of BN powder and $SiO_2$ are formed on the inner surface of the crucible 1 and the outer surface of the seed 7.

(e) Seed Attachment

The seed which is formed with the film on its outer surface in the aforementioned manner is inserted in and arranged on the bottom portion of the crucible which is provided with the film on its inner surface.

If the forward end portion of the seed has an edge, then the film formed on the inner surface of the crucible is disadvantageously separated by being scraped by the edge. Therefore, the seed is preferably inserted in the crucible from a chamfered end thereof.

Figure 8:
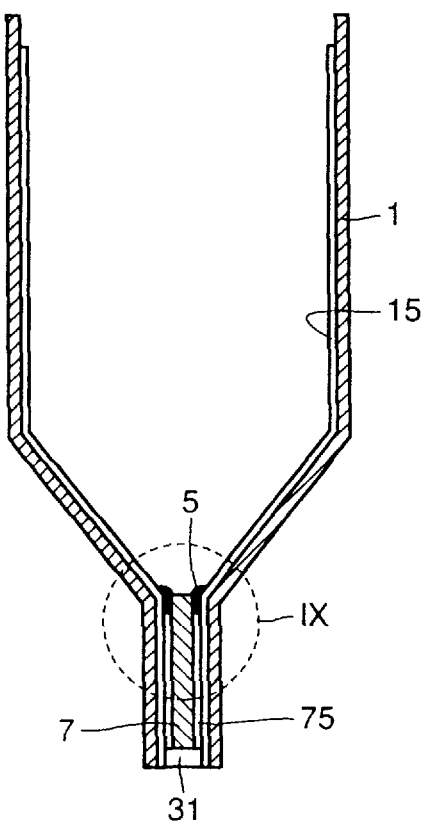
FIG. 8 illustrates a state of filling a gap between the crucible and the seed according to the present invention.

After the seed is attached, a cap or a plug 31 made of BN or pBN is preferably attached to the bottom portion of the crucible, so that the seed will not fall out from the crucible (see FIG. 8).

(f) Filling of Gap between Crucible and Seed

When the seed is attached to the bottom portion of the crucible in the aforementioned manner, a gap may be formed between the crucible and the seed. When a GaAs melt infiltrates into this gap, solidification may be started from this portion to cause polycrystallization.

Therefore, the gap between the crucible and the seed is preferably filled as follows. First, the mixed solution is applied to the gap between the crucible and the seed. This application of the mixed solution can be performed by dropping the mixed solution into the gap by a dropping pipette, or by spraying the solution into the gap. When the mixed solution is applied by spraying, it is necessary to wipe out the mixed solution adhering to an upper end surface of the seed after application. Alternatively, the upper end surface of the seed may be previously masked before spraying, in order to prevent adhesion of the mixed solution. The mixed solution mixing example 1 shown in Table 1 is preferable for the dropping application method, for example, while the mixed solution mixing example 2 shown in Table 2 is preferable for the spraying application method, for example.

Figure 9:
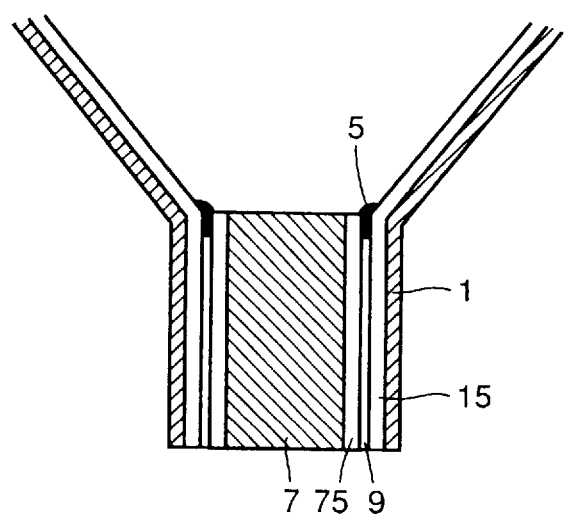
FIG. 9 is an enlarged sectional view showing a part IX in FIG. 8.

FIG. 8 is a sectional view showing a state of filling a gap between a crucible 1 and a seed 7, and FIG. 9 is a partially enlarged sectional view of a portion IX in FIG. 8. Referring to FIGS. 8 and 9, a gap 9 between the crucible 1 which is formed with a film 15 on its inner surface and the seed 7 which is formed with another film 75 on its outer surface is filled with a mixed solution 5.

(g) Vacuum Heating

Then, a vacuum heat treatment is performed in order to heat and polymerize the mixed solution filling the gap. For example, the heat treatment is preferably performed at a temperature of 500° to 600° C. causing no damage to the seed for 2 to 3 hours under an atmosphere having a degree of vacuum of $10^{-6}$ to $10^{-8}$ Torr.

Due to such a vacuum heat treatment, a film consisting of BN powder and $SiO_2$ is formed in the gap between the crucible and the seed.

(EXAMPLE 2)

While the above Example 1 has been described with reference to the films coating the inner surface of the crucible and the outer surface of the seed consisting of only BN serving as powdered solids and $SiO_2$ serving as vitreous substances, no softening is caused at the melting point of GaAs when only $SiO_2$ is employed as the vitreous substance.

However, when (1) $B_2O_3$ or (2) a mixture of $B_2O_3$ and $SiO_2$ is employed as the vitreous substance, for example, softening is caused at the melting point of GaAs. Consequently, the vitreous substance serving as a binder will not inhibit movement of BN particles serving as a lubricant, whereby the effect of the BN particles serving as a lubricant in the present invention can be further improved.

Methods of forming films and effects thereof are now described with reference to (1) $B_2O_3$ and (2) a mixture of $B_2O_3$ and $SiO_2$ employed as vitreous substances.

1) In Case of Employing $B_2O_3$ as Vitreous Substance (a) Methods of Film Formation (Method 1)

First, BN powder is applied to an inner surface of a crucible. Then, the crucible supplied with the BN powder is heated under an atmosphere of oxygen ($O_2$) gas or $O_2$ mixed gas at a temperature of 900° to 1200° C. Thus, the surface of the BN powder is oxidized along the following reaction (1):

$$4BN+3O_2 \rightarrow 2B_2O_3+2N_2 \tag{1}$$

Consequently, a film consisting of the BN powder and $B_2O_3$ is formed on the inner surface of the crucible.

(Method 2)

First, BN powder is mixed with boric acid ($H_3BO_3$) powder, and this mixture is further mixed with a solvent such as water or alcohol, to prepare a mixed solution. The prepared mixed solution is then applied to an inner surface of a crucible or an outer surface of a seed. Then, the crucible supplied with the mixed solution is heat treated under an atmosphere of nitrogen ($N_2$) gas, argon (Ar) gas or $O_2$ gas at a temperature of 300° to 1200° C. On the other hand, the seed supplied with the mixed solution is heat treated under an atmosphere of $N_2$ gas or Ar gas at a temperature of 300° to 600° C.

Consequently, a film consisting of BN particles and $B_2O_3$ is formed on the inner surface of the crucible or the outer surface of the seed.

(Method 3)

First, BN powder is mixed with boron oxide ($B_2O_3$) powder, and this mixture is further mixed with a solvent such as water or alcohol, to prepare a mixed solution. In such preparation of the mixed solution, the $B_2O_3$ powder may be previously dissolved in the solvent such as water or alcohol, to be then mixed with the BN powder.

The prepared mixed solution is then applied to an inner surface of a crucible or an outer surface of a seed. Then, the crucible supplied with the mixed solution is heat treated under an atmosphere of $N_2$ gas, Ar gas or $O_2$ gas at a temperature of 300° to 1200° C. On the other hand, the seed supplied with the mixed solution is heat treated under an atmosphere of $N_2$ gas or Ar gas at a temperature of 300° to 600° C.

Consequently, a film consisting of BN particles and $B_2O_3$ is formed on the inner surface of the crucible or the outer surface of the seed.

(b) Effect

This method is effective particularly in preparation of a semi-insulating crystal since there is no apprehension that Si will be mixed into the raw material melt, as compared with the case of employing $SiO_2$ as the vitreous substance.

2) In Case of Employing Mixture of $B_2O_3$ and $SiO_2$ as Vitreous Substance (a) Methods of Film Formation (Method 1)

First, BN powder is mixed with a silanol compound, to prepare a mixed solution. The silanol compound can be prepared from the aforementioned OCD, for example. Then, the prepared mixed solution is applied to an inner surface of a crucible. Then, the crucible which is supplied with the mixed solution is oxidized. Due to such oxidation, the BN powder contained in the mixed solution is oxidized to be partially converted to $B_2O_3$, while silanol is converted to silicon oxide ($SiO_2$).

Consequently, a film consisting of BN particles and a mixture of $B_2O_3$ and $SiO_2$ is formed on the inner surface of the crucible.

(Method 2)

First, BN powder, $B_2O_3$ powder and a silanol compound are mixed with each other, to prepare a mixed solution. The silanol compound can be prepared from the aforementioned OCD, for example. On the other hand, the $B_2O_3$ powder may be replaced with boric acid ($H_3BO_3$) powder.

Then, the prepared mixed solution is applied to an inner surface of a crucible or an outer surface of a seed. Then, the crucible which is supplied with the mixed solution is heat treated under an atmosphere of nitrogen ($N_2$) gas, argon (Ar) gas or oxygen ($O_2$) gas at a temperature of 300° to 1200° C. On the other hand, the seed supplied with the mixed solution is heat treated under an atmosphere of $N_2$ gas or Ar gas at a temperature of 300° to 600° C.

Consequently, a film consisting of BN particles and a mixture of $B_2O_3$ and $SiO_2$ is formed on the inner surface of the crucible or the outer surface of the seed.

(Method 3)

First, BN powder, $SiO_2$ powder and $B_2O_3$ powder are mixed with each other, and this mixture is further mixed with a solvent such as water or alcohol, to prepare a mixed solution. The $B_2O_3$ powder may be replaced with boric acid ($H_3BO_3$) powder.

Then, the prepared mixed solution is applied to an inner surface of a crucible or an outer surface of a seed. Then, the crucible which is supplied with the mixed solution is heat treated under an atmosphere of $N_2$ gas, Ar gas or $O_2$ gas at a temperature of 300° to 1200° C. On the other hand, the seed supplied with the mixed solution is heat treated under an atmosphere of $N_2$ gas or Ar gas at a temperature of 300° to 600° C.

Consequently, a film consisting of BN particles and a mixture of $B_2O_3$ and $SiO_2$ is formed on the inner surface of the crucible or the outer surface of the seed.

(Method 4)

First, BN powder and $SiO_2$ powder are mixed with each other, and this mixture is further mixed with a solvent such as water or alcohol, to prepare a mixed solution. Then, the prepared mixed solution is applied to an inner surface of a crucible. Then, the crucible which is supplied with the mixed solution is oxidized.

Consequently, a film consisting of BN particles and a mixture of $B_2O_3$ and $SiO_2$ is formed on the inner surface of the crucible.

(b) Effect

While a sufficient binder effect is attained by using only $B_2O_3$ as the vitreous substance contained in the film, $B_2O_3$ is readily influenced by moisture absorption, as follows. Namely, $B_2O_3$ is converted by moisture absorption to boric acid ($H_3BO_3$), which has no adhesion and is scattered by heating.

When $B_2O_3$ is converted to $H_3BO_3$, therefore, adhesion of the film is reduced and the vitreous substance contained in the film for serving as a binder is inadequate due to scattering caused by heating for melting the raw material, which ultimately leads to separation of the film. This may consequently result in crystal defects such as the generation of twins or microtwins or polycrystallization.

This apprehension can be eliminated by employing a mixture prepared by adding $SiO_2$ to $B_2O_3$ as the vitreous substance. In preparation of a GaAs single crystal, for example, the concentration of added $SiO_2$ is preferably 0.1 to 80 mol. %. The softening temperatures of $B_2O_3$ and $SiO_2$ are 300° to 350° C. and around 1500° C. respectively, and hence the softening temperature of the mixture thereof exceeds that of GaAs if the $SiO_2$ concentration exceeds 80 mol. %. If the $SiO_2$ concentration is smaller than 0.1 mol. %, on the other hand, $B_2O_3$ is influenced by moisture absorption. Further, the concentration of added $SiO_2$ is preferably 1 to 70 mol. %, and more preferably 5 to 60 mol. %.

In preparation of a GaP single crystal having a higher melting point than GaAs, on the other hand, the concentration of added $SiO_2$ is 0.1 to 90 mol. %, preferably 1 to 80 mol. %, and more preferably 5 to 70 mol. %.

In preparation of an InP single crystal having a lower melting point than GaAs, the concentration of added $SiO_2$ is 0.1 to 65 mol. %, preferably 1 to 55 mol. %, and more preferably 5 to 45 mol. %.

Advantages of the mixture of $B_2O_3$ and $SiO_2$ for serving as the vitreous substance are now described with reference to high and low $SiO_2$ concentrations.

When the $SiO_2$ concentration is low, i.e., when the $B_2O_3$ concentration is high in the mixture of $B_2O_3$ and $SiO_2$, the raw material is hardly contaminated with Si, and hence this mixture is preferably applied to preparation of a semi-insulating crystal.

When the $SiO_2$ concentration is high, i.e., when the $B_2O_3$ concentration is low in the mixture of $B_2O_3$ and $SiO_2$, on the other hand, a replacement reaction between the dopant of Si and boron (B) forming $B_2O_3$ is hardly caused so that the concentration of the dopant of Si is less reduced and the vitreous substance is less contaminated with boron (B). Thus, this mixture is preferably applied to preparation of an Si-doped crystal. When the $SiO_2$ concentration is increased, further, conversion of $B_2O_3$ to boric acid ($H_3BO_3$) resulting from moisture absorption is further effectively prevented, whereby the effect of the binder is sufficiently provided to improve adhesion of the film, while no $H_3BO_3$ is scattered during heating and hence no shortage of the vitreous substance for serving as a binder in the film is caused.

(3) Raw Material Charging

A crucible of pBN which was subjected to the aforementioned pretreatment was charged with 5 kg of GaAs polycrystalline raw material synthesized by a boat method (HB method). A dopant was prepared from 110 mg of a high purity silicon (Si) wafer. In order to keep the interior of a quartz ampoule at an equilibrium vapor pressure (1 atm.), it is preferable to add 1 g of high-purity arsenic (As) in the crucible along with the GaAs polycrystalline raw material.

(4) Vacuum Sealing

Figure 10:
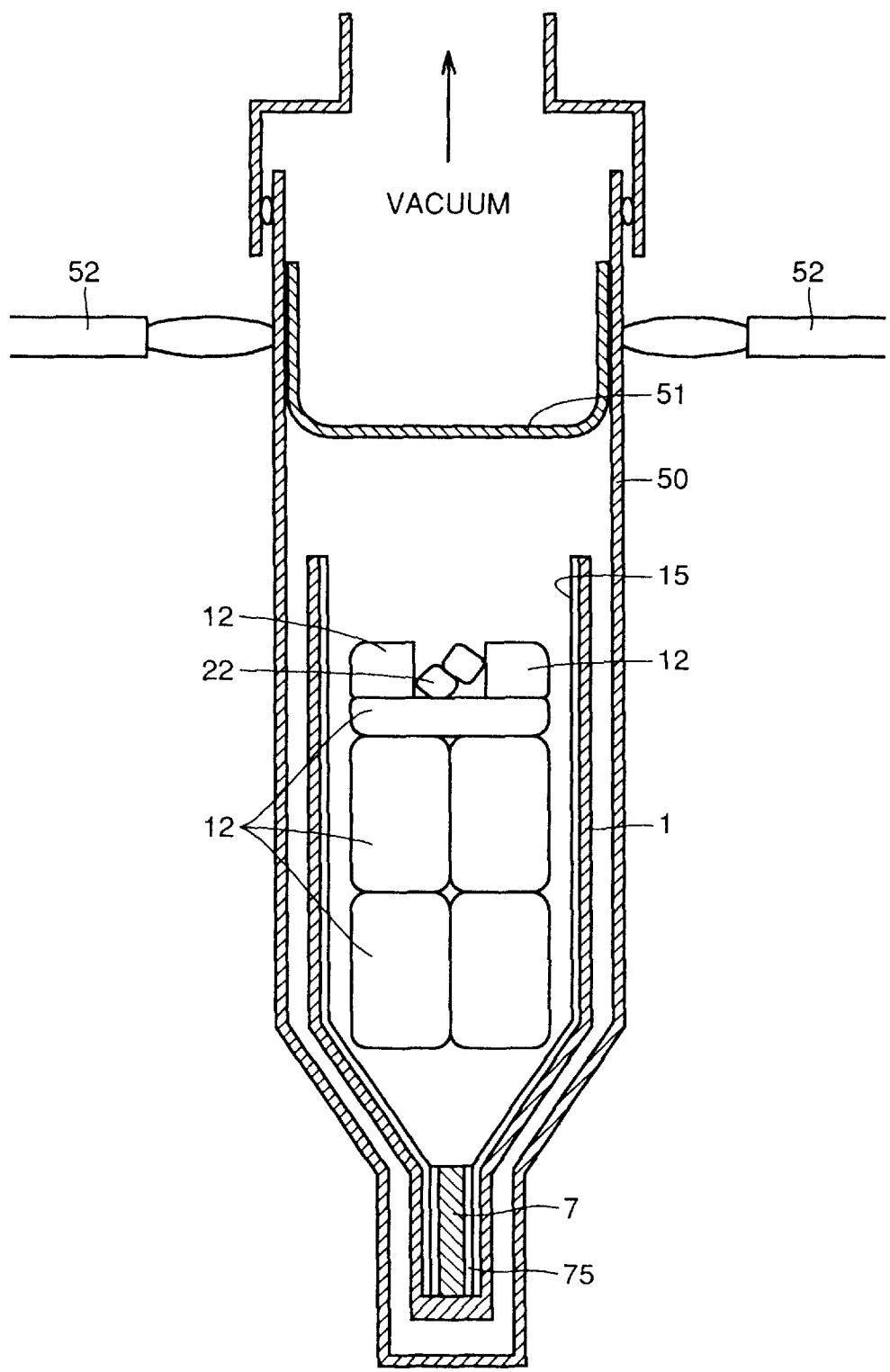
FIG. 10 is a sectional view showing a state of quartz ampoule sealing.

FIG. 10 is a sectional view showing a state of quartz ampoule sealing. A crucible 1 which was charged with polycrystalline raw material 12 in the aforementioned manner was arranged in a quartz ampoule 50, which was then covered with a quartz cap 51, evacuated and vacuum-sealed through a burner 52.

The crucible 1 was charged with the GaAs polycrystalline raw material 12 and an Si wafer 22 serving as a dopant, which was arranged in a depression formed by the polycrystalline raw material 12.

(5) Crystal Growth

GaAs crystal growth was carried out under ordinary conditions.

The VB method is adapted to reduce the temperature from a seed crystal side by upwardly moving a heater or downwardly moving an ampoule, thereby growing a single crystal. On the other hand, the VGF method is adapted to change the temperature profile of a heater while fixing the positional relation between the heater and an ampoule, thereby reducing the temperature from a seed crystal side and growing a single crystal.

Exemplary growth conditions for the VB method are now described.

Figure 11:
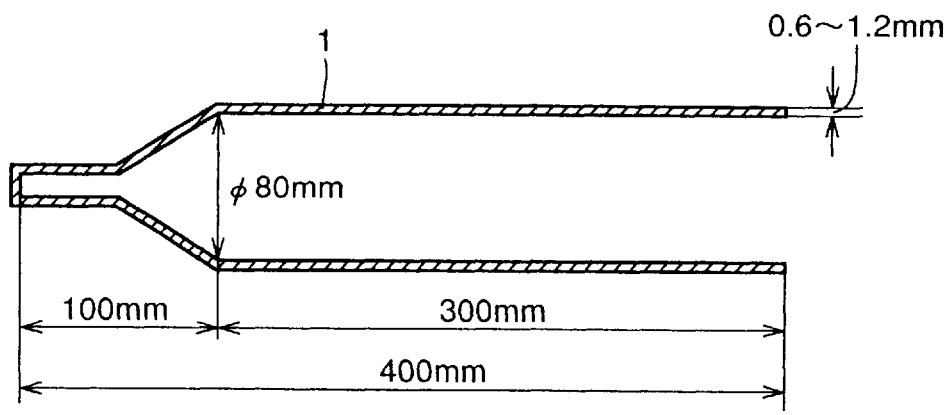
FIG. 11 illustrates the dimensions of a crucible employed in an Example of the present invention.
Figure 12:
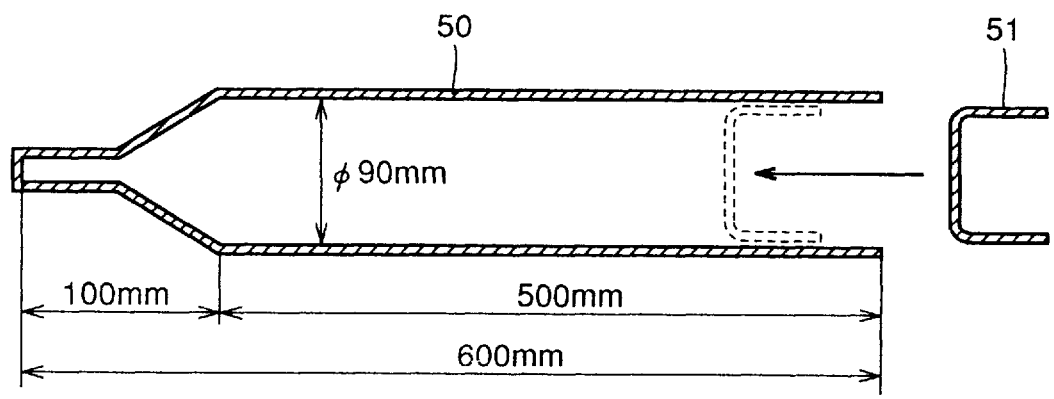
FIG. 12 illustrates the dimensions of a quartz ampoule employed in an Example of the present invention.
Figure 13:
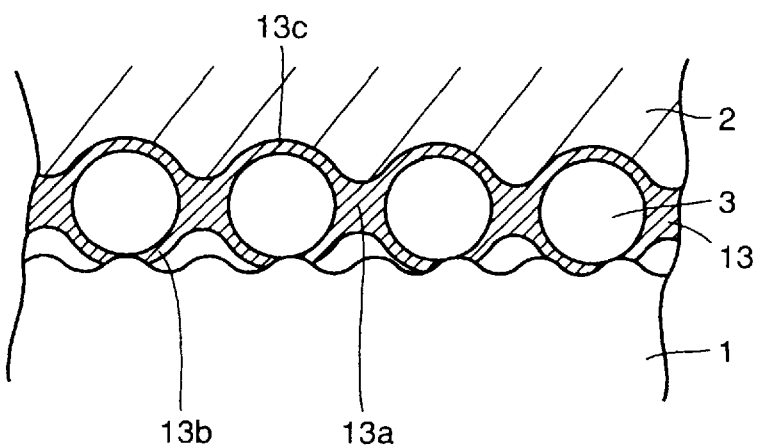
FIG. 13 typically illustrates the state of an interface between a crucible having an inner surface which is coated with a film consisting of powdered solids and a vitreous substance according to the present invention and a raw material melt.
Figure 14:
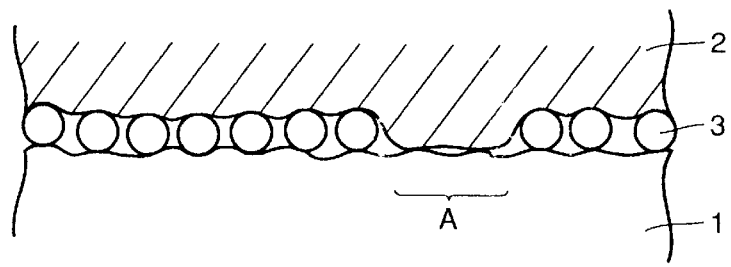
FIG. 14 typically illustrates the state of an interface between a crucible and a GaAs melt in preparation of a GaAs single crystal in accordance with the prior art.

FIGS. 11 and 12 show the dimensions of a crucible and a quartz ampoule as employed respectively.

First, the heater temperature was increased or the ampoule was moved toward a higher temperature side at a speed of 3° to 5° C./min., to melt the polycrystalline raw material. Then, the heater temperature was increased at a speed of 5° to 10° C./h., for partially melting the seed crystal thereby performing seeding.

Then, VB growth was carried out under the following conditions:

temperature of high temperature zone: 1245° to 1265° C.
temperature of low temperature zone: 1000° to 1150° C.
temperature gradient: 5° to 10° C./cm
heater moving speed: 2 to 7 mm/h.
heater moving distance: around 300 mm After the VB growth, the heater movement was stopped and cooling was carried out at 5° to 180° C./h. The cooling can be carried out from the temperature upon completion of the growth to room temperature at a speed of 180° C./h., for example. In order to suppress generation of crystal defects, the cooling can alternatively be carried out from the temperature upon completion of the growth to 1000° C. at a speed of 10° C./h., from 1000° C. to 800° C. at a speed of 30° C./h., and from 600° C. to room temperature at a speed of 100° C./h.

Table 7 shows the characteristics of the crystal grown in the aforementioned manner.

TABLE 7

| | EPD (Etch Pit Density) ($cm^{-2}$) | Si Concentration (=Carrier Concentration) ($cm^{-3}$) | Boron Concentration ($cm^{-3}$) |
|---|---|---|---|
| Shoulder Portion | 3,000–4,000 | $2 \times 10^{17}$ | $5 \times 10^{15}$–$5 \times 10^{16}$ |
| Middle Portion | 2,000–3,000 | $4$–$5 \times 10^{17}$ | $5 \times 10^{15}$–$5 \times 10^{16}$ |
| Tail Portion | 500–1000 | $1.5$–$2 \times 10^{18}$ | $1 \times 10^{16}$–$1 \times 10^{17}$ |

Figure 15:
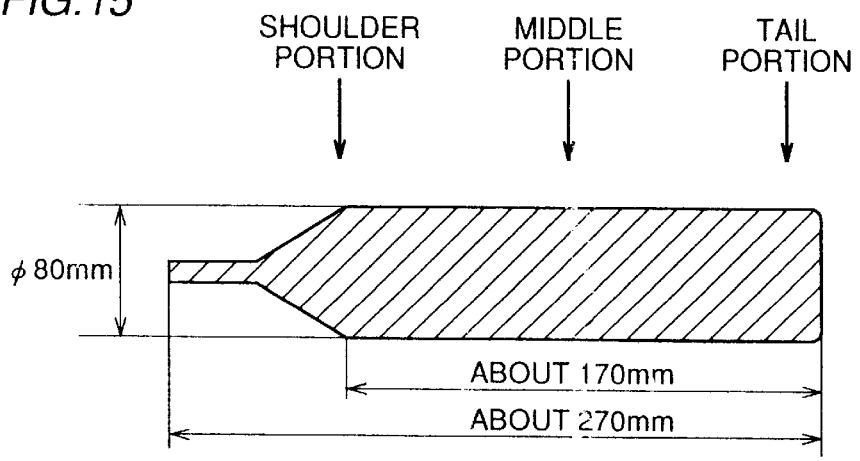
FIG. 15 is a sectional view showing a crystal grown according to an Example of the present invention.
Figure 16:
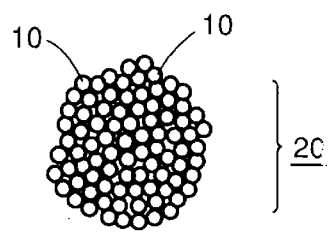
FIG. 16 is adapted to illustrate particle sizes of BN particles.
Figure 17:
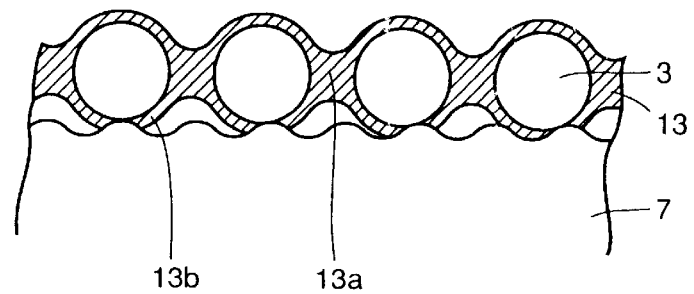
FIG. 17 typically illustrates the state of an outer surface of a seed crystal coated with a film consisting of powdered solids and a vitreous substance according to the present invention.

As to the shoulder, middle and tail portions shown in Table 7, refer to FIG. 15.

(6) Ampoule Breaking

After the crystal growth, the ampoule was broken to take out the GaAs single crystal. Table 8 shows the effects of the aforementioned Example of the present invention in comparison with those of the prior art. Referring to Table 8, "conventional example" indicates the case of employing liquid boron oxide ($B_2O_3$), and "prior art" indicates the case of employing solid boron nitride (BN).

TABLE 8

| | Film Adhesion | Crystallinity | Deviation in Si Concentration (Si-Doped GaAs) | B Concentration (In Case of Si $2 \times 10^{17}$ $cm^{-3}$) | Life of Crucible |
|---|---|---|---|---|---|
| Conventional Example | strong | excellent | large 20–30% | high at least $1 \times 10^{18}$ $cm^{-3}$ | short (5 times) |
| Prior Art | weak | easy to cause crystal defects | small within 5% | low not more than $5 \times 10^{16}$ $cm^{-3}$ | long (20–30 times) |
| Example of This Invention | strong | excellent | small within 5% | low not more than $5 \times 10^{16}$ $cm^{-3}$ | long (20–30 times) |

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of preparing a group II–VI or III–V compound single crystal from a polycrystalline group II–VI or III–V compound, comprising the steps of:

coating an inner surface of a crucible with a film consisting of powdered solids having a melting point higher than that of said polycrystalline compound and a vitreous substance;

placing said polycrystalline compound in said coated crucible;

placing said coated crucible with said polycrystalline compound therein into a furnace;

heating said crucible arranged in said furnace with said furnace thereby melting said polycrystalline compound in said crucible; and cooling said crucible and said melted compound for growing said single crystal.

2. The method of preparing a group II–VI or III–V compound single crystal in accordance with claim 1, wherein said step of coating said inner surface of said crucible comprises the steps of:

applying a mixed solution containing said powdered solids and a silanol compound to said inner surface of said crucible, and heating said crucible having said mixed solution applied on said inner surface, thereby forming said film containing said powdered solids and said vitreous substance, which consists of silicon oxide, on said inner surface of said crucible.

3. The method of preparing a group II–VI or III–V compound single crystal in accordance with claim 2, wherein said powdered solids contain boron nitride.

4. The method of preparing a group II–VI or III–V compound single crystal in accordance with claim 3, wherein said boron nitride has a mean particle size of at least 0.05 μm and not more than 10 μm.

5. The method of preparing a group II–VI or III–V compound single crystal in accordance with claim 1, wherein said vitreous substance has a softening temperature lower than the melting point of said polycrystalline compound.

6. The method of preparing a group II–VI or III–V compound single crystal in accordance with claim 5, wherein said vitreous substance contains $B_2O_3$.

7. The method of preparing a group II–VI or III–V compound single crystal in accordance with claim 6, wherein said powdered solids contain boron nitride.

8. The method of preparing a group II–VI or III–V compound single crystal in accordance with claim 7, wherein said boron nitride has a mean particle size of at least 0.05 $\mu$m and not more than 10 $\mu$m.

9. The method of preparing a group II–VI or III–V compound single crystal in accordance with claim 5, wherein said vitreous substance contains a mixture of $B_2O_3$ and $SiO_2$.

10. The method of preparing a group II–VI or III–V compound single crystal in accordance with claim 9, wherein said powdered solids contain boron nitride.

11. The method of preparing a group II–VI or III–V compound single crystal in accordance with claim 10, wherein said boron nitride has a mean particle size of at least 0.05 $\mu$m and not more than 10 $\mu$m.

12. The method of preparing a group II–VI or III–V compound single crystal in accordance with claim 1, wherein said inner surface of said crucible has a prescribed surface roughness in an uncoated state, said prescribed surface roughness being 10 to 150 $\mu$m in maximum height Ry, and 3 to 15 $\mu$m in arithmetical mean roughness $R_a$.

13. A method of preparing a group II–VI or III–V compound single crystal from a polycrystalline group II–VI or III–V compound in a vertically arranged crucible, comprising the steps of:

coating an inner surface of said crucible with a film consisting of powdered solids having a melting point higher than that of said polycrystalline compound and a vitreous substance;

placing a seed crystal consisting of a single crystal of said compound on a bottom portion of said crucible;

placing said polycrystalline compound in the remaining portion of said crucible;

placing said crucible having said seed crystal and said polycrystalline compound therein into a vertically arranged furnace capable of forming an upper high temperature zone and a lower low temperature zone;

adjusting the position of said furnace and the temperature of said upper high temperature zone thereby melting said polycrystalline compound while maintaining a part of said seed crystal in a solid state in said crucible;

setting said lower low temperature zone at a temperature lower than the melting point of said compound single crystal while setting said upper high temperature zone at a temperature higher than said melting point of said compound single crystal, thereby forming a solid-liquid interface; and vertically moving said solid-liquid interface away from said seed crystal by upwardly moving said furnace or downwardly moving said crucible thereby growing said compound single crystal.

14. The method of preparing a group II–VI or III–V compound single crystal in accordance with claim 13, wherein said step of coating said inner surface of said crucible comprises the steps of:

applying a mixed solution containing said powdered solids and a silanol compound to said inner surface of said crucible, and heating said crucible having said mixed solution applied on said inner surface thereof, thereby forming said film containing said powdered solids and said vitreous substance, which consists of silicon oxide, on said inner surface of said crucible.

15. The method of preparing a group II–VI or III–V compound single crystal in accordance with claim 14, wherein said powdered solids contain boron nitride.

16. The method of preparing a group II–VI or III–V compound single crystal in accordance with claim 15, wherein said boron nitride has a mean particle size of at least 0.05 $\mu$m and not more than 10 $\mu$m.

17. The method of preparing a group II–VI or III–V compound single crystal in accordance with claim 13, wherein said vitreous substance has a softening temperature lower than the melting point of said polycrystalline compound.

18. The method of preparing a group II–VI or III–V compound single crystal in accordance with claim 17, wherein said vitreous substance contains $B_2O_3$.

19. The method of preparing a group II–VI or III–V compound single crystal in accordance with claim 18, wherein said powdered solids contain boron nitride.

20. The method of preparing a group II–VI or III–V compound single crystal in accordance with claim 19, wherein said boron nitride has a mean particle size of at least 0.05 $\mu$m and not more than 10 $\mu$m.

21. The method of preparing a group II–VI or III–V compound single crystal in accordance with claim 17, wherein said vitreous substance contains a mixture of $B_2O_3$ and $SiO_2$.

22. The method of preparing a group II–VI or III–V compound single crystal in accordance with claim 21, wherein said powdered solids contain boron nitride.

23. The method of preparing a group II–VI or III–V compound single crystal in accordance with claim 22, wherein said boron nitride has a mean particle size of at least 0.05 $\mu$m and not more than 10 $\mu$m.

24. The method of preparing a group II–VI or III–V compound single crystal in accordance with claim 13, wherein said inner surface of said crucible has a prescribed surface roughness in an uncoated state, said prescribed surface roughness being 10 to 150 $\mu$m in maximum height Ry, and 3 to 15 $\mu$m in arithmetical mean roughness $R_a$.

25. A method of preparing a group II–VI or III–V compound single crystal from a polycrystalline group II–VI or III–V compound in a vertically arranged crucible, comprising the steps of:

coating an outer surface of a seed crystal consisting of a single crystal of said compound with a film consisting of powdered solids having a melting point higher than that of said polycrystalline compound and a vitreous substance;

placing said coated seed crystal on a bottom portion of said crucible;

placing said polycrystalline compound in the remaining portion of said crucible;

placing said crucible having said seed crystal and said polycrystalline compound therein into a vertically arranged furnace capable of forming an upper high temperature zone and a lower low temperature zone;

adjusting the position of said furnace and the temperature of said upper high temperature zone thereby melting said polycrystalline compound while maintaining a part of said seed crystal in a solid state in said crucible;

setting said lower low temperature zone at a temperature lower than the melting point of said compound single crystal while setting said upper high temperature zone at a temperature higher than said melting point of said compound single crystal, thereby forming a solid-liquid interface; and vertically moving said solid-liquid interface away from said seed crystal by upwardly moving said furnace or downwardly moving said crucible thereby growing said compound single crystal.

26. The method of preparing a group II–VI or III–V compound single crystal in accordance with claim 25, wherein said step of coating said outer surface of said seed crystal comprises the steps of:

applying a mixed solution containing said powdered solids and a silanol compound to said outer surface of said seed crystal, and heating said seed crystal having said mixed solution applied on said outer surface thereof, thereby forming said film containing said powdered solids and said vitreous substance, which consists of silicon oxide, on said outer surface of said seed crystal.

27. The method of preparing a group II–VI or III–V compound single crystal in accordance with claim 26, wherein said step of applying said mixed solution to said outer surface of said seed crystal is carried out by dipping said seed crystal in said mixed solution.

28. The method of preparing a group II–VI or III–V compound single crystal in accordance with claim 26, wherein said step of applying said mixed solution to said outer surface of said seed crystal is carried out by spraying said mixed solution onto said outer surface of said seed crystal.

29. The method of preparing a group II–VI or III–V compound single crystal in accordance with claim 25, wherein said vitreous substance has a softening temperature lower than the melting point of said polycrystalline compound.

30. The method of preparing a group II–VI or III–V compound single crystal in accordance with claim 29, wherein said vitreous substance contains $B_2O_3$.

31. The method of preparing a group II–VI or III–V compound single crystal in accordance with claim 30, wherein said powdered solids contain boron nitride.

32. The method of preparing a group II–VI or III–V compound single crystal in accordance with claim 31, wherein said boron nitride has a mean particle size of at least 0.05 $\mu$m and not more than 10 $\mu$m.

33. The method of preparing a group II–VI or III–V compound single crystal in accordance with claim 29, wherein said vitreous substance contains a mixture of $B_2O_3$ and $SiO_2$.

34. The method of preparing a group II–VI or III–V compound single crystal in accordance with claim 33, wherein said powdered solids contain boron nitride.

35. The method of preparing a group II–VI or III–V compound single crystal in accordance with claim 34, wherein said boron nitride has a mean particle size of at least 0.05 $\mu$m and not more than 10 $\mu$m.

36. A method of preparing a group II–VI or III–V compound single crystal from a polycrystalline group II–VI or III–V compound in a vertically arranged crucible, comprising the steps of:

coating an inner surface of said crucible with a film consisting of powdered solids having a melting point higher than that of said polycrystalline compound and a vitreous substance;

coating an outer surface of a seed crystal consisting of a single crystal of said compound with a film consisting of powdered solids having a melting point higher than that of said polycrystalline compound and a vitreous substance;

placing said coated seed crystal on a bottom portion of said crucible;

placing said polycrystalline compound in the remaining portion of said crucible;

placing said crucible having said seed crystal and said polycrystalline compound therein into a vertically arranged furnace capable of forming an upper high temperature zone and a lower low temperature zone;

adjusting the position of said furnace and the temperature of said upper high temperature zone thereby melting said polycrystalline compound while maintaining a part of said seed crystal in a solid state in said crucible;

setting said lower low temperature zone at a temperature lower than the melting point of said compound single crystal while setting said upper high temperature zone at a temperature higher than said melting point of said compound single crystal, thereby forming a solid-liquid interface; and vertically moving said solid-liquid interface away from said seed crystal by upwardly moving said furnace or downwardly moving said crucible thereby growing said compound single crystal.

37. The method of preparing a group II–VI or III–V compound single crystal in accordance with claim 36, wherein said step of coating said inner surface of said crucible comprises the steps of:

applying a mixed solution containing said powdered solids and a silanol compound to said inner surface of said crucible, and heating said crucible having said mixed solution applied on said inner surface thereof, thereby forming said film containing said powdered solids and said vitreous substance, which consists of silicon oxide, on said inner surface of said crucible.

38. The method of preparing a group II–VI or III–V compound single crystal in accordance with claim 37, wherein said powdered solids contain boron nitride.

39. The method of preparing a group II–VI or III–V compound single crystal in accordance with claim 38, wherein said boron nitride has a mean particle size of at least 0.05 μm and not more than 10 μm.

40. The method of preparing a group II–VI or III–V compound single crystal in accordance with claim 36, wherein said vitreous substance has a softening temperature lower than the melting point of said polycrystalline compound.

41. The method of preparing a group II–VI or III–V compound single crystal in accordance with claim 40, wherein said vitreous substance contains $B_2O_3$.

42. The method of preparing a group II–VI or III–V compound single crystal in accordance with claim 41, wherein said powdered solids contain boron nitride.

43. The method of preparing a group II–VI or III–V compound single crystal in accordance with claim 42, wherein said boron nitride has a mean particle size of at least 0.05 μm and not more than 10 μm.

44. The method of preparing a group II–VI or III–V compound single crystal in accordance with claim 40, wherein said vitreous substance contains a mixture of $B_2O_3$ and $SiO_2$.

45. The method of preparing a group II–VI or III–V compound single crystal in accordance with claim 44, wherein said powdered solids contain boron nitride.

46. The method of preparing a group II–VI or III–V compound single crystal in accordance with claim 45, wherein said boron nitride has a mean particle size of at least 0.05 μm and not more than 10 μm.

47. The method of preparing a group II–VI or III–V compound single crystal in accordance with claim 36, further comprising a step of coating a gap between said crucible and said seed crystal with a film consisting of powdered solids and a vitreous substance after placing said seed crystal on said bottom portion of said crucible.

48. The method of preparing a group II–VI or III–V compound single crystal in accordance with claim 36, wherein said group II–VI or III–V compound includes gallium arsenide.

* * * * *

UNITED STATES PATENT AND TRADEMARK OFFICE
CERTIFICATE OF CORRECTION

PATENT NO. : 5,830,269
DATED : Nov. 3, 1998
INVENTOR(S) : Kawase et al.

It is certified that error appears in the above-identified patent and that said Letters Patent is hereby corrected as shown below:

On the Title Page: under "References Cited FOREIGN PATENT DOCUMENTS"
    line 3, delete the entire line;
    line 4, delete the entire line.

Signed and Sealed this

Fourth Day of May, 1999

Attest:

Q. TODD DICKINSON

*Attesting Officer*     *Acting Commissioner of Patents and Trademarks*